United States Patent
Wagener et al.

(10) Patent No.: US 10,816,428 B2
(45) Date of Patent: Oct. 27, 2020

(54) FIELD DEVICE INTERFACE SEAL AND ELECTRICAL INSULATION

(71) Applicant: Rosemount Inc., Shakopee, MN (US)

(72) Inventors: Andrew John Wagener, Minneapolis, MN (US); Trevor Thomas Stroth, Edina, MN (US); Sarah Ellen LaCroix, Shorewood, MN (US)

(73) Assignee: ROSEMOUNT INC., Shakopee, MN (US)

( * ) Notice: Subject to any disclaimer, the term of this patent is extended or adjusted under 35 U.S.C. 154(b) by 213 days.

(21) Appl. No.: 16/015,924

(22) Filed: Jun. 22, 2018

(65) Prior Publication Data
US 2019/0391030 A1    Dec. 26, 2019

(51) Int. Cl.
*G01L 19/14*    (2006.01)
*G01L 19/00*    (2006.01)
(Continued)

(52) U.S. Cl.
CPC .......... *G01L 19/14* (2013.01); *G01L 19/0038* (2013.01); *H05K 5/0204* (2013.01);
(Continued)

(58) Field of Classification Search
CPC . G01L 19/14; G01L 19/0038; G01L 19/0007; G01L 13/025; H05K 5/061;
(Continued)

(56) References Cited

U.S. PATENT DOCUMENTS 4,776,600 A    10/1988    Kohn
5,292,155 A    3/1994    Bell et al.
(Continued)

FOREIGN PATENT DOCUMENTS

CN    102331324    1/2012
CN    104470271    3/2015

OTHER PUBLICATIONS

Office Action from Chinese Patent Application No. 201821587692.4, dated Mar. 25, 2019.
(Continued)

*Primary Examiner* — Suman K Nath
(74) *Attorney, Agent, or Firm* — Westman, Champlin & Koehler, P.A.

(57) ABSTRACT

A field device assembly includes an industrial process field device, a flange and a sealing and electrically insulating system. The field device includes a pressure sensor and a housing containing the active component. The housing includes a base having a base interface, which includes a first base process opening. The flange is attached to the base of the housing and includes a coplanar interface having a first flange process opening. The sealing and electrically insulating system includes a gasket that includes a dielectric material. A first process opening in the gasket is aligned with the first base process opening and the first flange process opening. A first surface of the gasket engages the base interface, and a second surface of the gasket that is opposite the first surface engages the coplanar interface. The gasket electrically insulates the housing of the field device from the flange.

19 Claims, 12 Drawing Sheets

(51) Int. Cl.
*H05K 5/02* (2006.01)
*H05K 5/06* (2006.01)
*G01L 13/02* (2006.01)

(52) U.S. Cl.
CPC ......... *H05K 5/0217* (2013.01); *H05K 5/0247* (2013.01); *H05K 5/061* (2013.01); *G01L 13/025* (2013.01)

(58) Field of Classification Search
CPC .. H05K 5/0247; H05K 5/0217; H05K 5/0204; F16L 41/008; F16L 25/028; F16L 39/00
See application file for complete search history.

(56) References Cited

U.S. PATENT DOCUMENTS

| | | |
|---|---|---|
| 5,316,320 A | 5/1994 | Breaker |
| 6,059,254 A | 5/2000 | Sundet et al. |
| 6,402,159 B1 | 6/2002 | Kohn |
| 7,080,558 B2 | 7/2006 | Broden et al. |
| 8,132,464 B2 | 3/2012 | Broden et al. |
| 9,642,273 B2 | 5/2017 | Norman et al. |
| 2005/0087020 A1* | 4/2005 | Ueyanagi ............ G01L 19/0084 73/753 |
| 2011/0266755 A1 | 11/2011 | Anderson et al. |
| 2015/0090039 A1* | 4/2015 | Broden .................... F16J 15/06 73/706 |

OTHER PUBLICATIONS

Notification of Transmittal of the International Search Report and the Written Opinion of the International Searching Authority from International Application No. PCT/US2019/035511, dated Sep. 4, 2019.
"Instrumentation Products Schneider DirectMount Systems", Jan. 2017 (listed on p. 20), pp. 1-20.
Brochure by Advance Products & Systems, LLC, entitled "Flange Isolating Gasket Kits", Rev. Aug. 17, 2017, 8 pgs.
Office Action from Chinese Patent Application No. 201811136789. 8, dated Aug. 4, 2020.

* cited by examiner

FIELD DEVICE INTERFACE SEAL AND ELECTRICAL INSULATION

BACKGROUND

Embodiments of the present disclosure relate to industrial process control systems for industrial plants. More specifically, embodiments of the present disclosure relate to sealing and electrically insulating an interface of a field device, such as an interface between the field device and a manifold, for example.

In industrial settings, control systems are used to monitor and control inventories of industrial and chemical processes, and the like. Typically, the control system performs these functions using industrial process field devices distributed at key locations in the industrial process and coupled to the control circuitry in the control system by a process control loop. The term "field device" refers to any device that performs a function in a distributed control or process monitoring system, including all devices currently known, or yet to be known, that are used in the measurement, control, and/or monitoring of industrial processes.

Typical field devices include device circuitry that enables the field device to perform conventional field device tasks such as process parameter monitoring and measurements using one or more sensors, and/or process control operations using one or more control devices. Exemplary sensors include pressure sensors, level sensors, temperature sensors, and other sensors used in industrial processes. Exemplary control devices include actuators, solenoids, valves, and other control devices.

The device circuitry of field devices may also include a controller that is used to control the sensors and/or control devices, and communicate with a process control system or other circuitry, over a process control loop, such as a 4-20 mA process control loop, for example. In some installations, the process control loop is used to deliver a regulated current and/or voltage to the field device for powering the field device. The process control loop can also carry data, such as a process parameter value corresponding to a sensed process parameter. This data may be communicated over the process control loop as an analog signal, or as a digital signal.

Cathodic protection is a technique used in many industrial applications to protect metallic structures, such as pipes and tanks, from corrosion. For example, large pipeline structures may use an impressed current cathodic protection system. This type of cathodic protection requires any electrical instrumentation attached to the pipeline to be electrically insulated with some type of dielectric material.

SUMMARY

Embodiments of the present disclosure are directed to field device assemblies that include a sealing and electrically insulating system, and a method of sealing and electrically insulating an industrial process field device using the system. Some embodiments of the field device assembly include an industrial process field device, a flange and a sealing and electrically insulating system. The field device includes a pressure sensor and a housing containing the active component. The housing includes a base having a base interface, which includes a first base process opening. The flange is attached to the base of the housing and includes a coplanar interface having a first flange process opening. The sealing and electrically insulating system includes a gasket that includes a dielectric material. A first process opening in the gasket is aligned with the first base process opening and the first flange process opening. A first surface of the gasket engages the base interface, and a second surface of the gasket that is opposite the first surface engages the coplanar interface. The gasket electrically insulates the housing of the field device from the flange.

In some embodiments of the method, the coplanar interface surrounding a first flange process opening is engaged with the first annular protuberance. The base interface surrounding a first base process opening is engaged with the O-ring. The field device is electrically insulated from the flange using the gasket. A first sealed passageway is formed between the coplanar interface and the base interface and through the first flange process opening, the first gasket process opening, the O-ring and the first base process opening comprising compressing the O-ring and the gasket between the base interface and the flange interface.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Figure 1A:
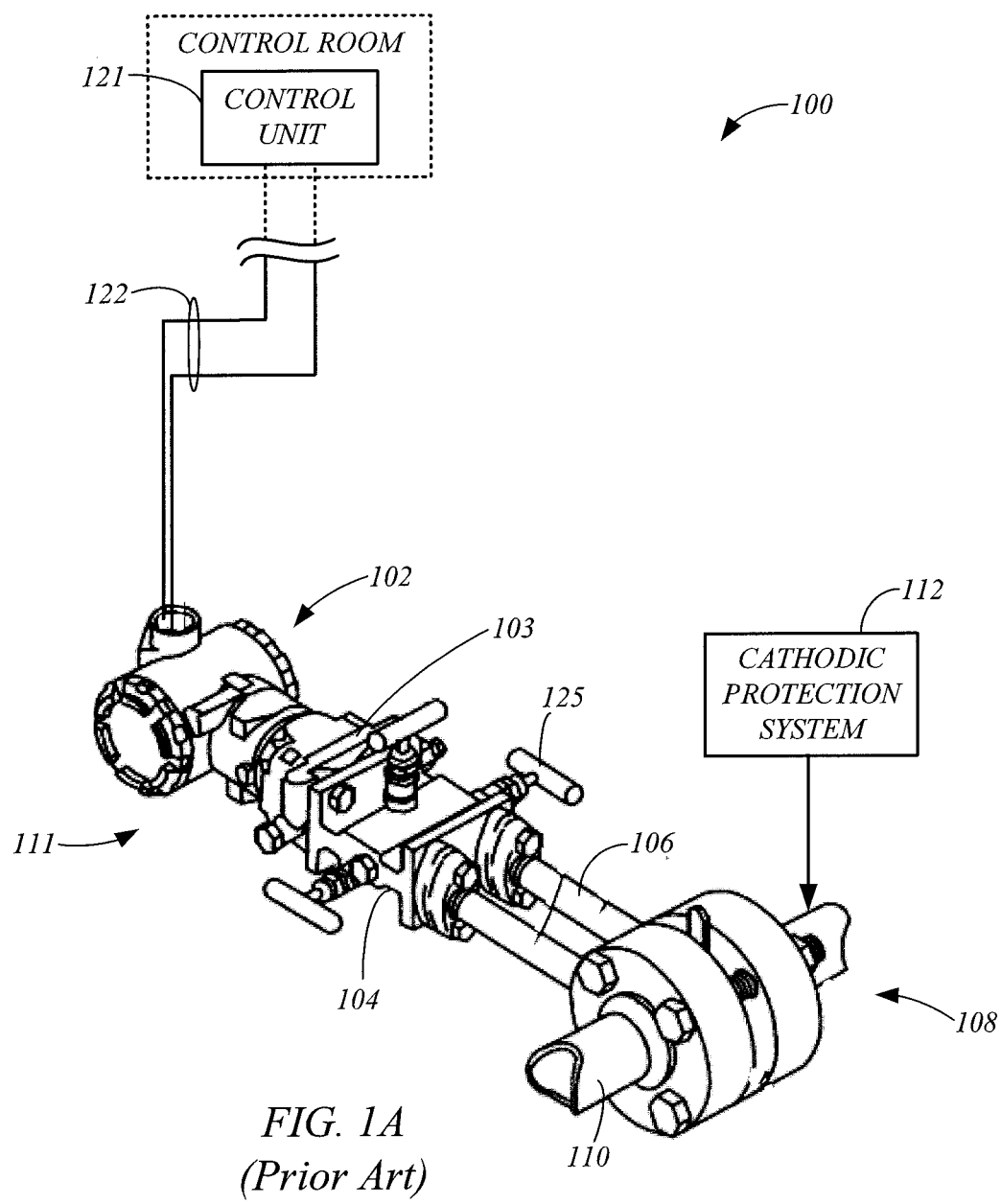
FIGS. 1A-C respectively show a simplified diagram of exemplary industrial process control system, an isometric view of a field device assembly exploded from a process interface, and an isometric view of a field device assembly mounted to a process interface, in accordance with the prior art.

Embodiments of the present disclosure are described more fully hereinafter with reference to the accompanying drawings. Elements that are identified using the same or similar reference characters refer to the same or similar elements. As used herein the term "about" or "substantially" refers to ±10% of a value, an angle, etc., and the terms denote equality with a tolerance of at most 10%, unless stated otherwise. The word "exemplary" is used herein to mean "serving as an example, instance or illustration." The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

FIG. 1A is a simplified diagram of exemplary industrial process measurement or control system 100, in accordance with the prior art. The system 100 is used in the processing of a material to transform the material from a less valuable state into more valuable and useful products, such as petroleum, chemicals, paper, food, etc. For example, an oil refinery performs industrial processes that can process crude oil into gasoline, fuel oil, and other petrochemicals.

The system 100 includes an industrial process field device 102, a transmitter flange or adapter 103, a manifold 104, and/or a process interface 106 that connects the manifold 104 and the field device 102 to an industrial process 108. In some embodiments, the process 108 involves a process material, such as a fluid (i.e., liquid or gas), that is contained or transported through a process vessel 110, such as a pipe, a tank, or another process vessel.

The field device 102 is mounted to the adapter 103, which is mounted to the manifold 104 to form a field device assembly 111. The adapter 103 generally adapts the fluid paths of the field device 102 to the fluid paths of the manifold 104. The assembly 111 is sealed at the junction between the field device 102 and the adapter 103, the junction between the adapter 103 and the manifold 104, and the junction between the manifold 104 and the process interface 106 using conventional techniques.

A cathodic protection system 112 may be used to provide corrosion protection for the pipe 110, or other structure to which the field device 102 is attached, such as a tank. The cathodic protection system 112 may take on any suitable form, such as an impressed current cathodic protection system or a galvanic cathodic protection system, for example.

Figure 1B:
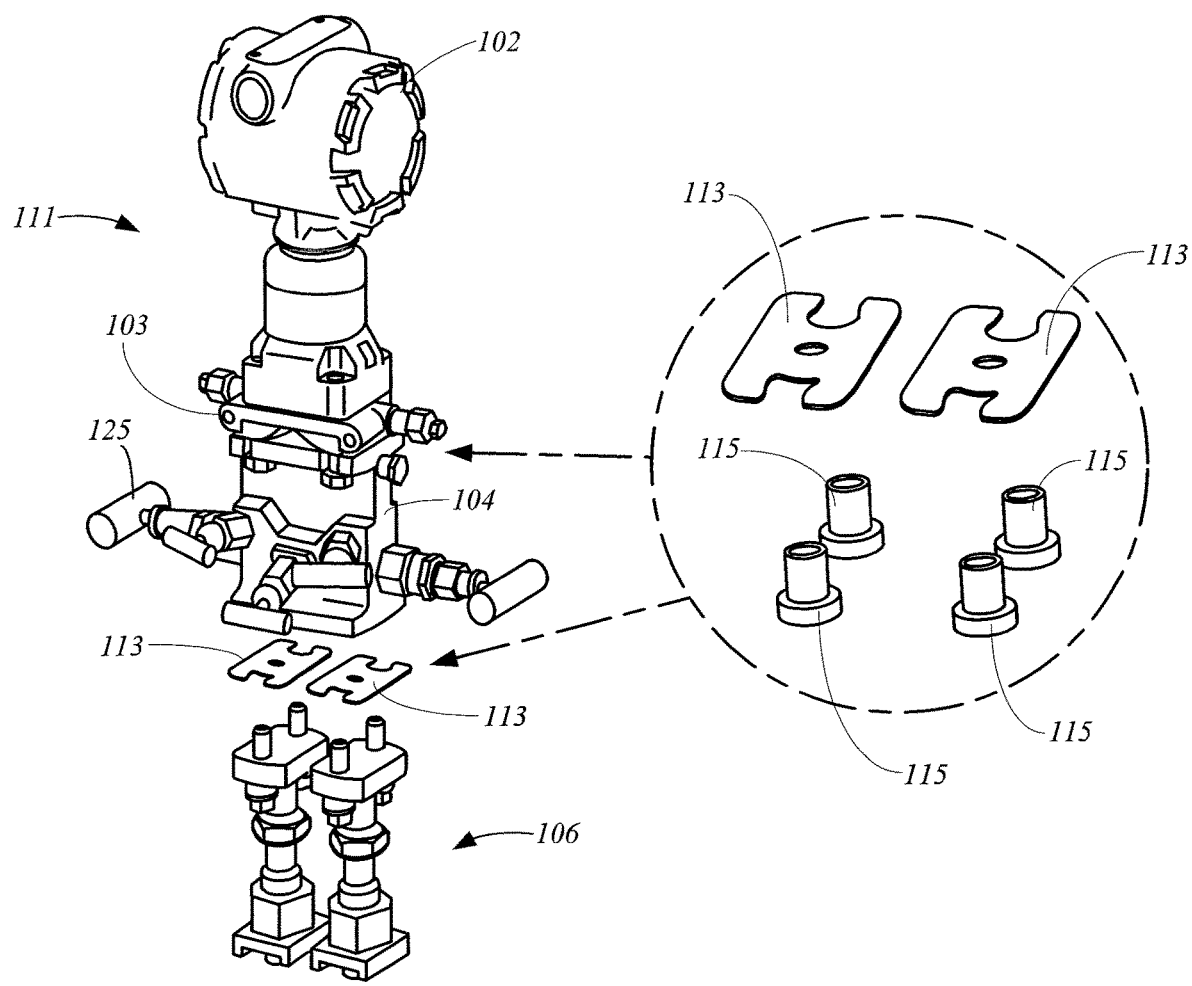

The field device assembly 111 of the prior art may include a conventional dielectric gasket 113 between the adapter 103 and the manifold 104, or between the manifold 104 and the process interface 106. Such conventional gaskets include a dielectric material that electrically isolates the electronics of the field device 102 from the cathodic protection scheme implemented by the system 112, as illustrated in FIG. 1B, which, is an isometric view of the field device assembly 111 exploded from the process interface 106, in accordance with the prior art. Additionally, these gaskets 113 are configured for manifolds 104 having an industry standard process connection spacing of 2.126 inches. Bolt sleeves 115 formed of a dielectric material, such as polyether ketone (PEEK), may also be used in the field device assembly 111 to electrically insulate the bolts used to attach the members of the assembly 111 together.

Figure 1C:
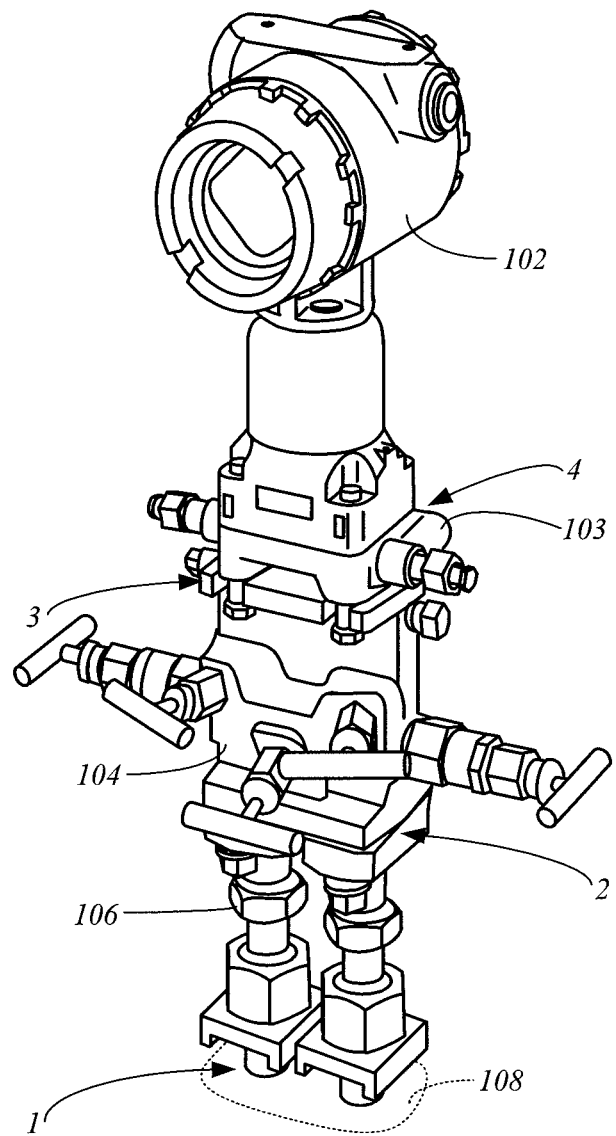

FIG. 1C is an isometric view of the field device assembly 111 mounted to the process interface 106, in accordance with the prior art. As shown in FIGS. 1A and 1C, there are generally four leak paths in the assembled system. Two of the leak paths correspond to the interfaces between the process interface 106 and the process (arrow 1 in FIG. 1C) and the manifold 104 (arrow 2 in FIG. 1C). The field device assembly 11 adds another two leak paths; a leak path between the adaptor 103 and the manifold 104 (arrow 3 in FIG. 1C), and a leak path between the adapter 103 and the field device 102 (arrow 4 in FIG. 1C).

Figure 2:
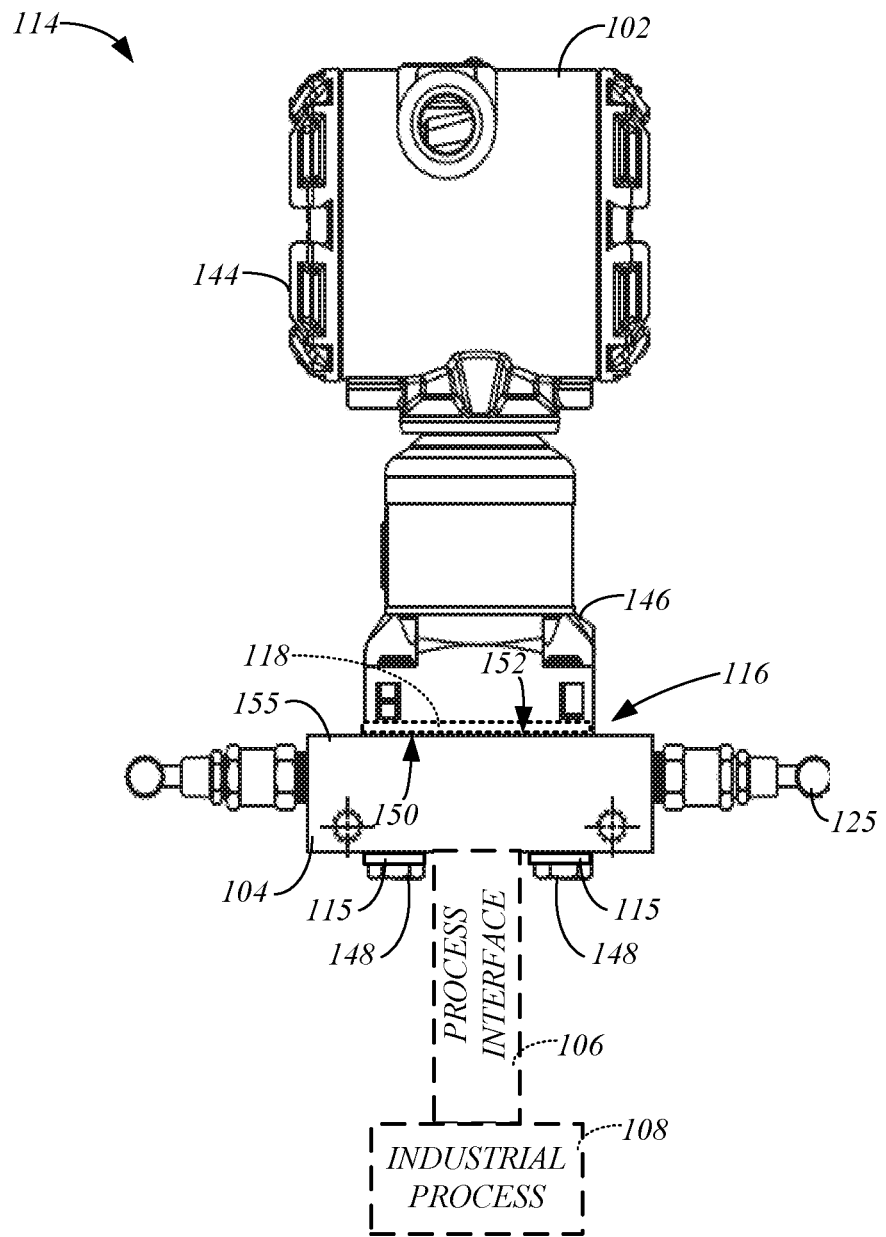
FIG. 2 is a side view of an exemplary field device assembly for an industrial process, in accordance with embodiments of the present disclosure.
Figure 3:
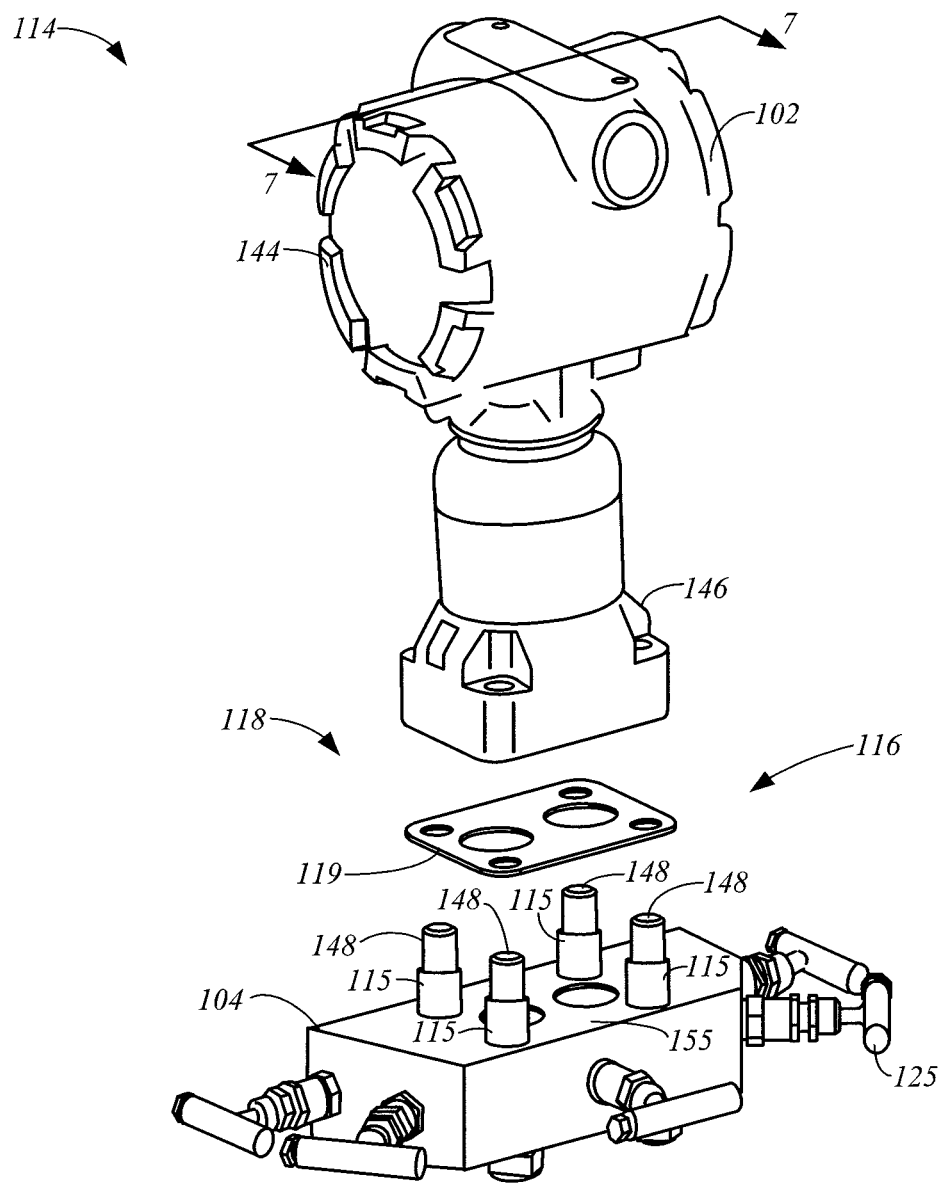
FIG. 3 is an exploded isometric view of the field device assembly of FIG. 2, in accordance with embodiments of the present disclosure.

Embodiments of the present disclosure are generally directed to a field device assembly 114, in which the adapter 103 of the prior art assembly 111 has been removed. FIG. 2 is a side view of an example of the field device assembly 114 for an industrial process, and FIG. 3 is an exploded isometric view of the assembly 114, in accordance with embodiments of the present disclosure. FIG. 2 also schematically illustrates the attachment of the field device assembly 114 to an exemplary process interface 106 and process 108, which are shown in phantom lines. The field device assembly 114 includes a single leak path at an interface 116 between the field device 102 and the manifold 104. A sealing and electrically insulating system 118 (shown in phantom lines) at the interface 116 protects the electronics of the field device 102 from cathodic protection schemes, such as that produced by the system 112. Accordingly, the field device assembly 114 of the present disclosure reduces the number of potential leak paths relative to the prior art system by eliminating the adapter 103.

Figure 4:
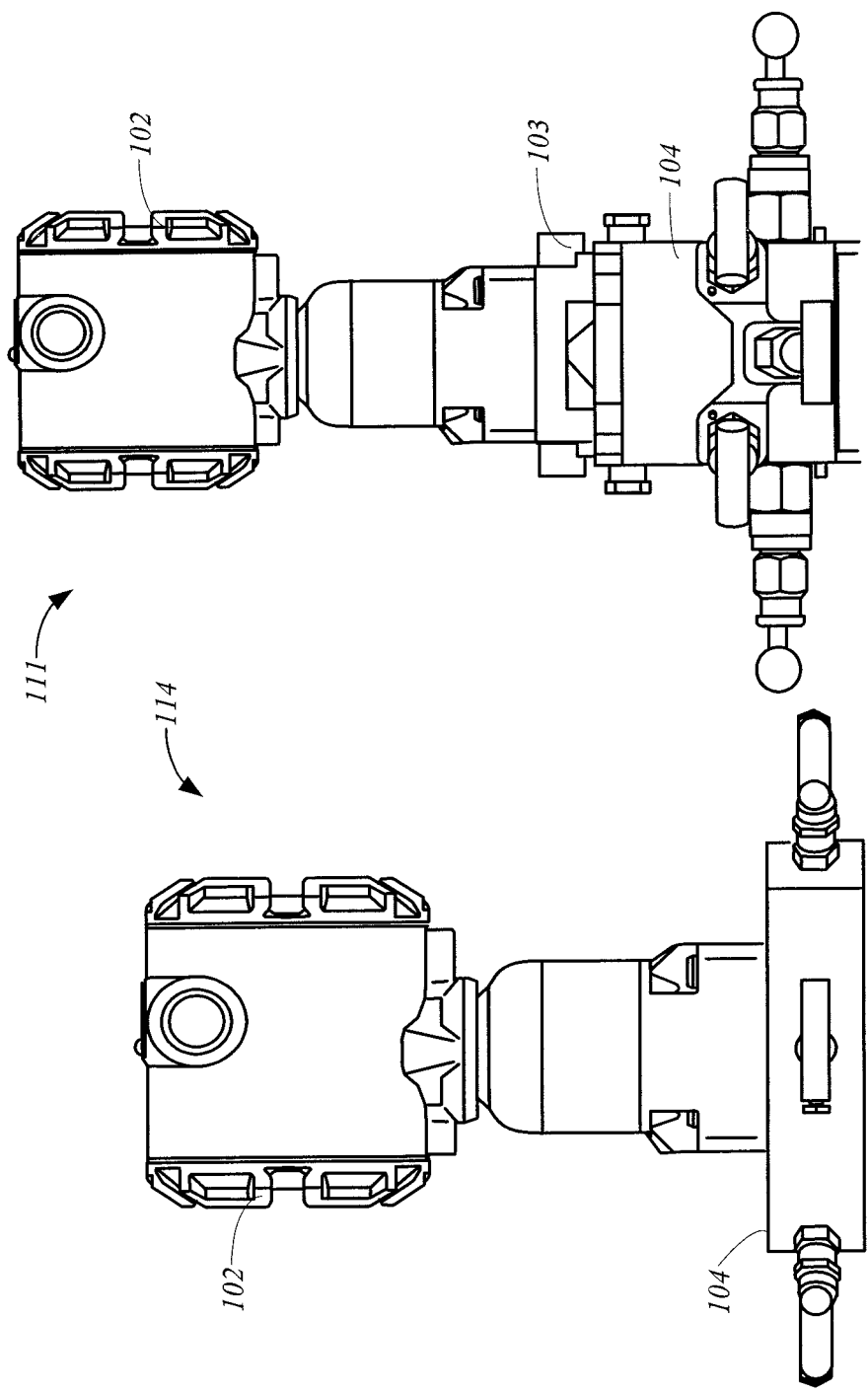
FIG. 4 shows side-by-side plan views of the field device assembly of FIG. 2 and the prior art field device assembly of FIGS. 1A-C.

Additionally, the field device assembly 114 provides a more compact solution relative to the prior art field device assembly 111. This is generally shown in FIG. 4, in which side views of the field device assembly 114 and the prior art field device assembly 114 are shown side-by-side. The field device assembly 114 is shorter than the prior art field device assembly 111 by about the height of the adapter 103. This may cause the height of the field device assembly 114 to be approximately 3.6 inches shorter than the prior art field device 111. The shortened assembly 114 allows greater flexibility in mounting the assembly.

Figure 5:
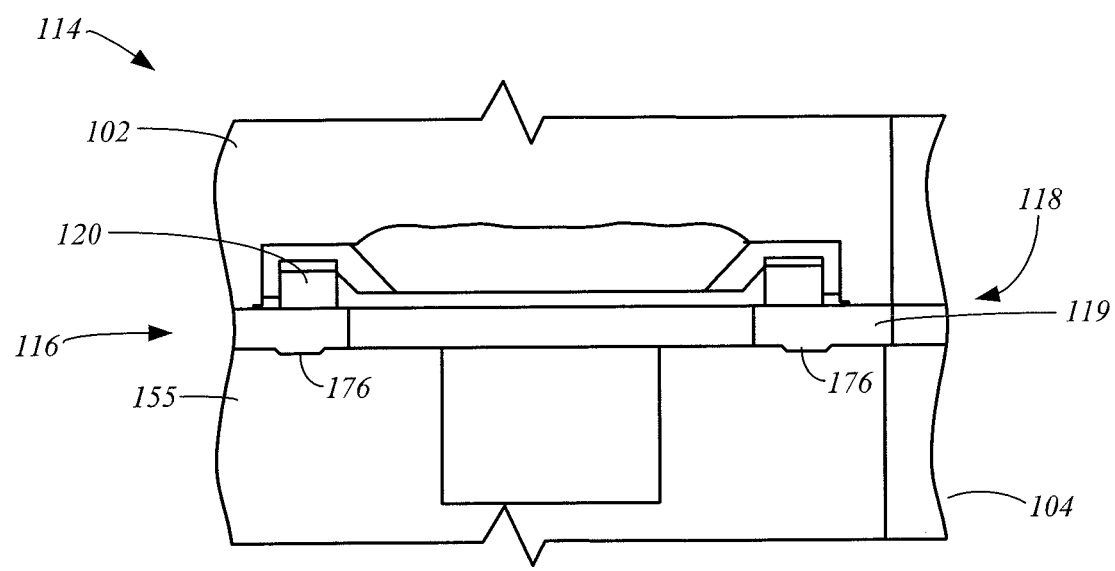
FIG. 5 is a simplified cross-sectional view of a portion of the field device assembly illustrating an exemplary sealing and electrically insulating system, in accordance with embodiments of the present disclosure.

FIG. 5 is a simplified cross-sectional view of a portion of the field device assembly 114 illustrating an exemplary sealing and electrically insulating system 118, in accordance with embodiments of the present disclosure. As discussed below in greater detail, the system 118 generally includes a gasket 119 at the interface 116 between the manifold 104 and the field device 102. The gasket 119, which is also shown in FIG. 3, operates to electrically insulate the field device 102 from cathodic protection schemes that are conducted to the manifold 104, such as those implemented by the cathodic protection system 112 (FIG. 1A). Additionally, the gasket 119 forms a seal between the field device 102 and the manifold 104. In some embodiments, the system 118 also includes an O-ring 120, which forms a seal between the field device 102 and the gasket 119.

Figure 6:
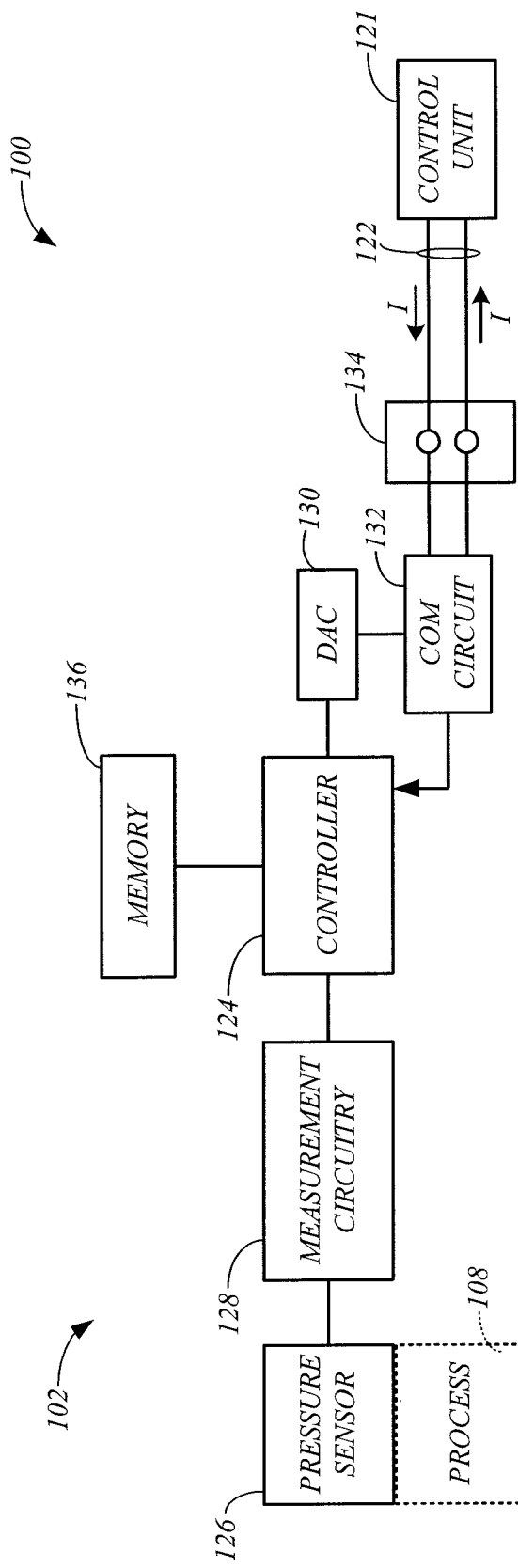
FIG. 6 is a simplified block diagram of an exemplary field device in the form of a pressure transmitter, in accordance with embodiments of the present disclosure.

Before describing embodiments of the field device assembly 114 of the present disclosure in detail, various embodiments of the field device 102 will be described with reference to FIG. 1 and FIG. 6, which is a simplified block diagram of an exemplary field device 102 in the form of a pressure transmitter, in accordance with embodiments of the present disclosure.

The field device 102 may communicate with a computerized control unit 121, which may be configured to control the field device 102. The control unit 121 may be remotely located from the field device 102, such as in a control room for the system 100, as shown in FIG. 1. The control unit 121 may be communicatively coupled to the field device 102 over a suitable physical communication link, such as a two-wire control loop 122, or a wireless communication link.

Communications between the control unit 121 and the field device 102 may be performed over the control loop 122 in accordance with conventional analog and/or digital communication protocols. In some embodiments, the process control loop 122 includes a 4-20 milliamp process control loop, in which a process variable may be represented by a level of a loop current I (FIG. 2) flowing through the process control loop 122. Exemplary digital communication protocols include the modulation of digital signals onto the analog current level of the two-wire process control loop 122, such as in accordance with the HART® communication standard. Other purely digital techniques may also be employed including FieldBus and Profibus communication protocols. Wireless protocols, such as IEC 62591, may also be employed.

In some embodiments, the field device 102 is in the form of a pressure transmitter that is configured to sense a single pressure or a differential pressure of the process 108. The field device includes a controller 124, one or more pressure sensors 126, measurement circuitry 128, a digital-to-analog converter (DAC) 130, a communications circuit 132, and/or a terminal block 134, as shown in FIG. 6.

The controller 124 may represent one or more processors (i.e., microprocessor, central processing unit, etc.) that control components of the field device 102 to perform one or more functions described herein in response to the execution of instructions, which may be stored locally in non-transitory computer readable media or memory 136 of the device 102. In some embodiments, the processors of the controller 124 are components of one or more computer-based systems. The controller 124 may include one or more control circuits, microprocessor-based engine control systems, one or more programmable hardware components, such as a field programmable gate array (FPGA), that are used to control components of the device 102 to perform one or more functions described herein. The controller 124 may also represent other conventional field device circuitry.

Valving 125 of the manifold 104 may be adjusted to expose the field device 102 to the process 108, such as through the process interface 106, in accordance with conventional manifolds 104. This allows the field device 102 to sense or measure a pressure or differential pressure of the process 108 using one or more pressure sensors represented by block 126 in FIG. 6.

The measurement circuitry 128 represents circuitry that interacts with the sensor 126. For instance, the circuitry 128 may include circuitry that translates an output from the sensor 126 for use by a controller 124 of the field device 102.

The DAC 130 may be used by the controller 124 to convert digital signals into analog signals that are communicated to the control unit 121 using the communications circuit 132, such as over the two-wire process control loop 122 by adjusting the loop current I to indicate a value of a process parameter sensed by the sensor 126, for example. The controller 124 may also receive communications from the control unit 121 through the communications circuit 132 using conventional techniques.

As mentioned above, the sealing and electrically insulating system 118 seals the interface 116 between the field device 102 and the manifold 104, and electrically isolates the field device 102 from the manifold 104 to protect the electronics of the field device 102 from cathodic protection schemes, such as that provided by the system 112 (FIG. 1A). Details of embodiments of the system 118 and the field device 102 will be described with reference to FIG. 7, which is a simplified cross-sectional view of a portion of the assembly 114 taken generally along line 7-7 of FIG. 3, when the assembly 114 is assembled (FIG. 2).

The field device 102 includes a housing 144 that encloses and protects the electronics of the field device 102 from environmental conditions. The housing 144 includes a base 146 that may be mounted to the manifold 104 using bolts 148 that are isolated from the base 146 and the manifold 104 using bolt sleeves 115, as shown in FIGS. 2 and 3. In some embodiments, the interface 116 is formed between a base interface 150 of the base 146 and a coplanar interface 152 of the manifold 104.

The coplanar interface 152 includes one or more manifold process openings 154, such as manifold process openings 154A and 154B, that are each aligned in a plane of a flange 155 of the manifold 104. While the coplanar interface 152 is illustrated as being formed on the flange 155 of a manifold 104, it is understood that embodiments of the field device assembly 114 may utilize any suitable flange having a coplanar interface 152 in place of the depicted manifold 104, such as a traditional flange, a coplanar flange, a German Institute for Standardization (DIN) flange, or other flange. Accordingly, embodiments of the field device assembly 114 include a combination of the field device 102, a flange 155 having a coplanar interface 152 and one or more openings 154, and the sealing and electrically insulating system 118 at the interface 116 between the coplanar interface 152 of the flange 155 and the base 146 of the field device 102, for example.

Figures 7, 8:
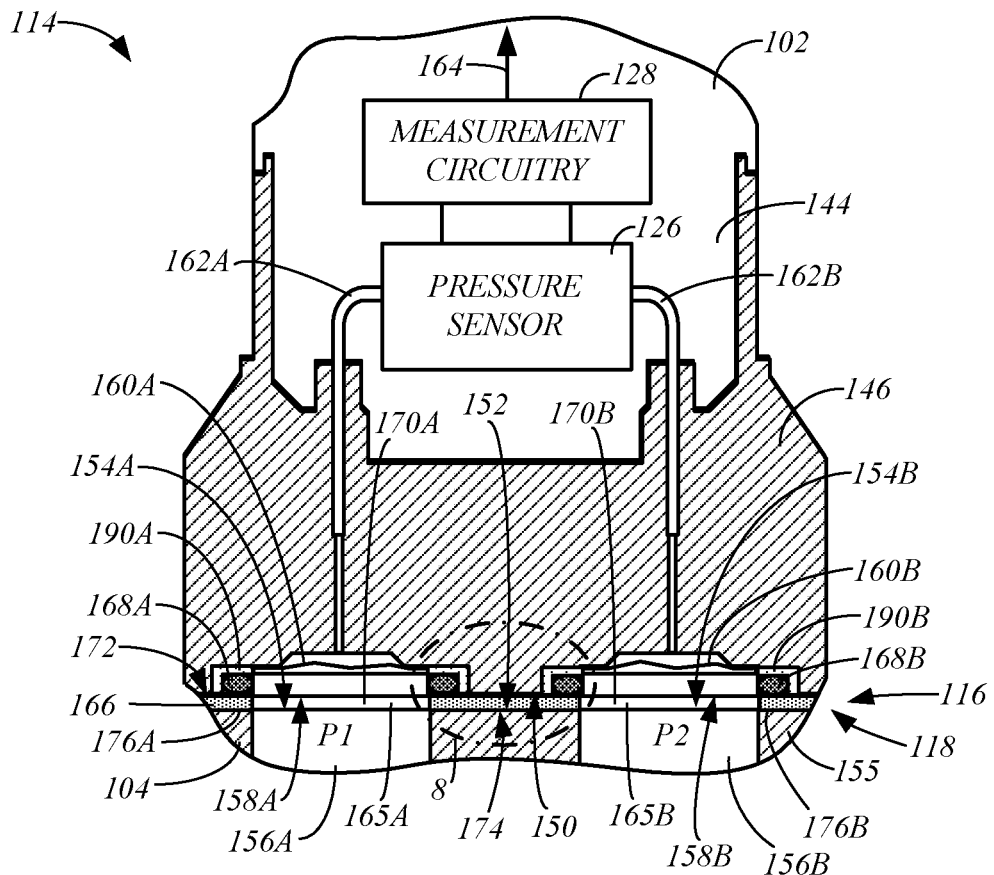
FIG. 7 is a simplified cross-sectional view of a portion of the assembly of FIG. 3 taken generally along line 7-7, in accordance with embodiments of the present disclosure.
FIG. 8 is a magnified view of portions of a sealing and electrically insulating system of the field device assembly of FIG. 4 within the circle 5, in accordance with embodiments of the present disclosure.

In some embodiments, the openings 154A and 154B open to corresponding fluid passageways 156 of the manifold 104 (i.e., flange 155), such a fluid passageways 156A and 156B, as shown in FIG. 7. The fluid passageways 156A and 156B may be coupled to the process 108 through a suitable process interface 106, as shown in FIG. 2. The manifold interface 152 may be substantially flat.

The base interface 150 includes one or more base process openings 158, such as base process openings 158A and 158B, that are configured to align with the corresponding manifold process openings 154A and 154B. The base process openings 158 allow the sensor or sensors 126 of the field device 102 to be exposed to the process provided by the manifold 104 through the passageways 156. The base interface 150 may be substantially flat.

The one or more manifold process openings 154 and base process openings 158 may be used to expose a sensor 126 to process parameters. For example, the exemplary field device 102 is in the form of a differential pressure transmitter that includes diaphragms 160A and 160B that are respectively exposed to pressures P1 and P2 in the passageways 156A and 156B of the manifold 104 through the manifold process openings 154A and 154B and the base process openings 158A and 158B, as shown in FIG. 7. The diaphragms 160A and 160B flex in response to the pressures P1 and P2. The flexing diaphragms 160A and 160B communicate the sensed pressure to the pressure sensor 126 through lines 162A and 162B, which may be filled with a hydraulic fluid. The measurement circuitry 128 may receive one or more signals from the sensor 126, and produce a differential pressure signal, which is indicated by arrow 164. The controller 124 may communicate the differential pressure measurement indicated by the signal 164 to the control unit 121 using any suitable technique, such as by adjusting the current I over the two-wire process control loop 122, as discussed above with reference to FIG. 6.

The sealing and electrically insulating system 118 forms sealed passageways 165A and 165B at the interface 116 between the manifold process openings 154A and 154B and the base process openings 158A and 158B, to prevent the leakage of process fluids at the interface 116, and to ensure that a proper process measurement (e.g., pressure measurement) may be taken. Additionally, the system 118 electrically isolates the sensor 126, the measurement circuitry 128, the controller 124 and/or additional field device circuitry from cathodic protection schemes that could be conducted to the housing 144 of the field device 102 through the manifold 104. That is, due to the system 118, no electrically conductive path exists between the manifold 104 and the field device 102 that could expose electronics of the field device 102 to a cathodic protection scheme implemented by the system 112 (FIG. 1A).

While the exemplary field device 102 of FIGS. 2 and 7 is in the form of a differential pressure transmitter, it is understood that embodiments of the present disclosure are not limited to differential pressure transmitters. Thus, embodiments of the system 118 may be used with other types of field devices 102, in which the system 118 may be useful in forming sealed passageways 165 and/or providing electrical isolation, such as, for example, field devices that measure a pressure, a temperature, a flow rate, and/or measure another process parameter or control a process.

In some embodiments, the sealing and electrically insulating system 118 includes a gasket 166, which was previously represented by gasket 119 in FIGS. 3 and 5. In some embodiments, the system 118 also includes and one or more O-rings 168, as previously represented by O-ring 120. Each of the O-rings 168 may be separate from the gasket 166. That is, in some embodiments, the O-rings 168 are not integrally formed or secured within a recess of the corresponding gasket 166.

Figure 9:
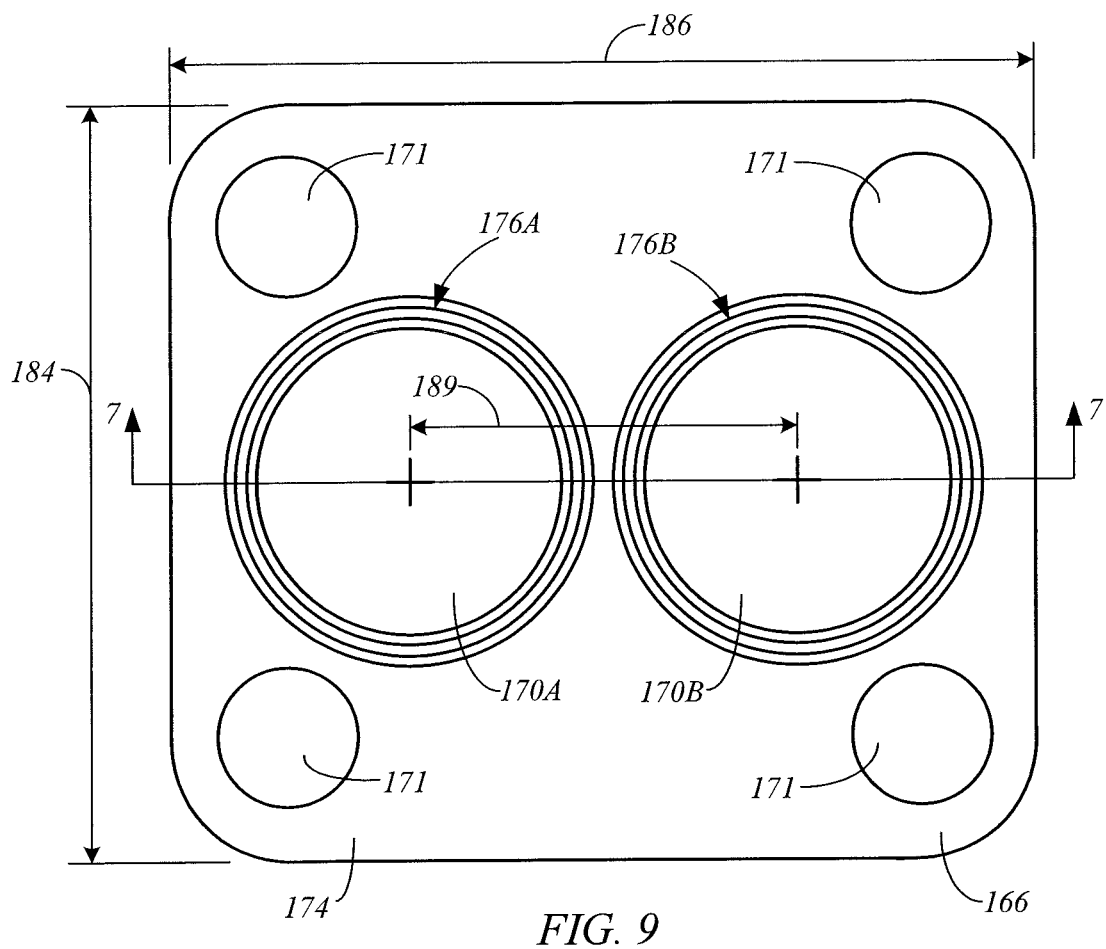
FIG. 9 is a bottom view of an exemplary gasket, in accordance with embodiments of the present disclosure.
Figure 10:
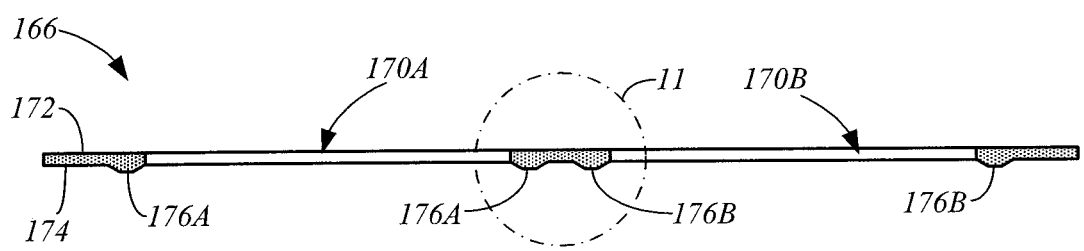
FIG. 10 is a side cross-sectional view of the gasket of FIG. 9 taken generally along line 10-10.
Figure 11:
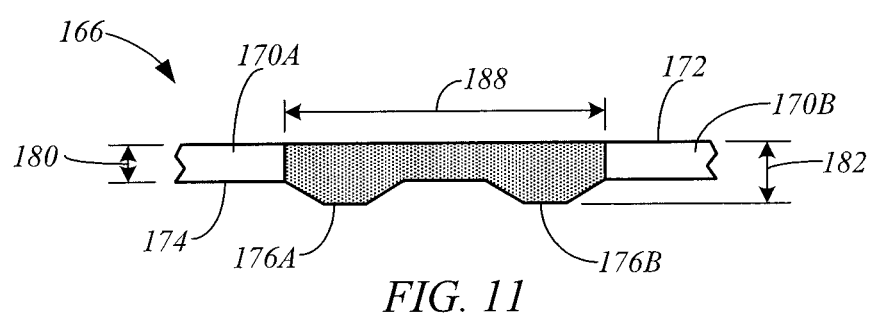
FIG. 11 is a magnified view of the portion of the gasket of FIG. 7 within circle 11.

FIG. 8 is a magnified view of portions of the system 118 at the interface 116 within the circle 8 of FIG. 7. FIG. 9 is a bottom view of an exemplary gasket 166 formed in accordance with embodiments of the present disclosure. FIG. 10 is a side cross-sectional view of the gasket 166 of FIG. 9 taken generally along line 10-10, and FIG. 11 is a magnified view of the portion of the gasket 166 within circle 11 of FIG. 7.

The gasket 166 includes, or is formed substantially of, a dielectric material, such as polyoxymethylene (POM), for example, to provide the desired electrical insulation for the field device 102. In some embodiments, the gasket 166 is formed of a substantially homogenous material. In some embodiments, the gasket lacks metal plates. The gasket 166 substantially or completely covers the base interface 150 and displaces the base interface 150 from the manifold interface 152, as shown in FIGS. 7 and 8. This arrangement prevents direct contact between the housing 144 of the field device 102 and the manifold 104 and electrically isolates the field device 102 from the manifold 104.

The gasket 166 includes one or more gasket process openings 170 that correspond to the base process openings 158 and the manifold process openings 154. For example, the gasket 166 may include gasket process openings 170A and 170B that respectively align with the corresponding base process openings 158A and 158B and the manifold process openings 154A and 154B. The gasket 166 may also include bolt openings 171, through which the bolts 148 may extend to attach the manifold 104 to the base 146.

In some embodiments, the manifold process openings 154, the base process openings 158, and the gasket process openings 170 are substantially the same size and shape. In some embodiments, the gasket process openings 170 are circular and have a diameter of approximately 1.0 inch. In some embodiments, the distance 188 (FIG. 11) separating the gasket process openings 170A and 170B may be approximately 0.30 inch. Additionally, in some embodiments, the centers of the gasket process openings 170 are separated by a distance 189 (FIG. 9) that is less than the standardized distance of 2.126 inches, such as approximately 1.30 inches, for example.

Figure 12:
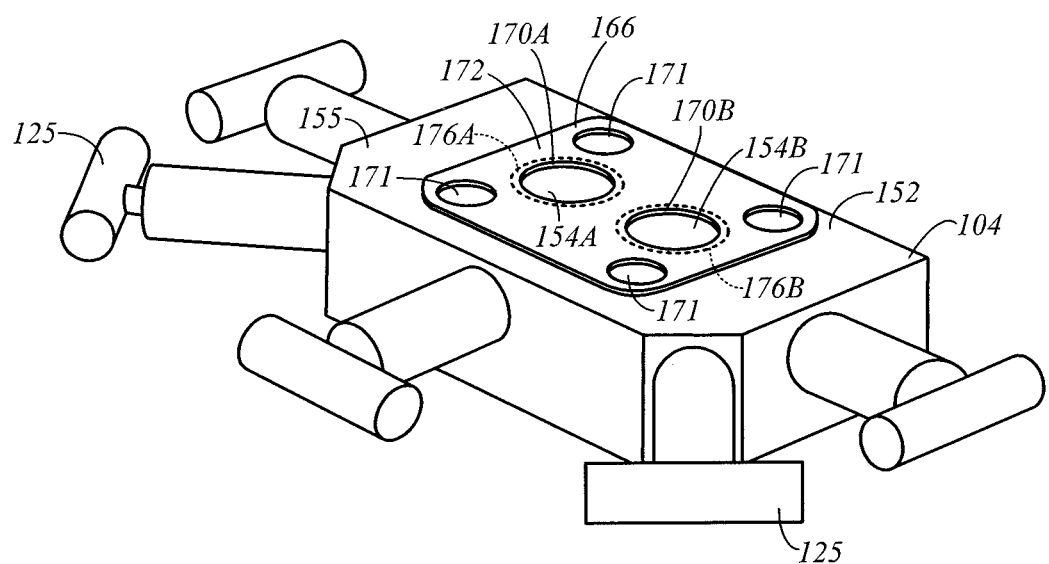
FIG. 12 is an isometric view of an exemplary manifold and a gasket, in accordance with embodiments of the present disclosure.

The gasket 166 includes a top surface 172 and a bottom surface 174, as shown in FIG. 10. The top surface 172 is configured to engage the base interface 150, as shown in FIGS. 7 and 8. The bottom surface 174 is configured to engage the manifold interface 152, as shown in FIGS. 7 and 8, and FIG. 12, which is an isometric view of an exemplary manifold 104 illustrating the alignment of the gasket openings 170 with the manifold openings 154. In some embodiments, the gasket 166 includes annular protuberances 176, such as annual protuberances 176A and 176B, that extend from the bottom surface 174 and surround each of the gasket process openings 170, as shown in FIG. 9. The protuberances 176 are configured to engage the manifold interface 152 surrounding the corresponding manifold process openings 154, as illustrated in FIG. 12.

In some embodiments, the gasket 166 has a uniform thickness 180 except at the protuberances 176, where the gasket 166 has a larger thickness 182, as shown in FIG. 11. During compression of the gasket 166 against the manifold interface 152 (FIG. 8), an increased sealing pressure is applied to the manifold interface 152 surrounding the openings 154 by the protuberances 176. This enhances the seal formed around the manifold process openings 154 by the gasket 166.

In some embodiments, the thickness 180 of the gasket is within range of 0.050-0.070 inch, such as 0.060 inch. In some embodiments, the thickness 182 of the gasket 166 at the protuberances 176 is approximately 10-22% thicker than the thickness 180 of the remainder of the gasket 166. Thus, the thickness 182 may range from 0.066-0.085 inch, for example. In some embodiments, the thickness 182 is approximately 0.005-0.015 inch greater than the thickness 180, such as 0.010 inch greater than the thickness 180.

The gasket 166 is generally sized to match the surface area of the base interface 150 to electrically insulate the field device 102 from the manifold 104. In some embodiments, the gasket 166 has a width 184 that is approximately 2.40 inches, and a length 186 that is approximately 2.90 inches, as shown in FIG. 9.

Each of the O-rings 168 may take on any suitable form. In some embodiments, the one or more O-rings 168 are each hot-pressed O-rings formed of polytetrafluoroethylene or other suitable material. Each of the O-rings 168 engages the surface 172 of the gasket 166 surrounding the gasket process opening 170 to form a seal therebetween, as shown in FIGS. 7 and 8. Thus, the O-ring 168A engages surface 172 of the gasket 166 surrounding the gasket process opening 170A to form a seal around the opening 170A, and the gasket 168B engages the surface 172 of the gasket 166 surrounding the gasket process opening 170B to form a seal around the opening 170B.

Each of the O-rings 168 also forms a seal against the base interface 150 around a corresponding base process opening 158, as shown in FIGS. 7 and 8. In some embodiments, the base interface 150 includes one or more weld rings 190, such as weld rings 190A and 190B, that respectively surround the base process openings 158A and 158B. In some embodiments, each O-ring 168 engages the corresponding weld ring 190 to form a seal around the corresponding base process opening 158 between the O-ring 190 and the base interface 150.

Accordingly, the system 118 operates to form a seal at the manifold interface 152 around each of the manifold process openings 154 and the gasket process openings 170, a seal at the interface between the gasket 166 and the O-ring 168 around each of the gasket process openings 154, and a seal at the interface between the O-ring 168 and base interface 150 around each of the base process openings 158. Thus, the system 118 forms the sealed passageways 165 at the interface 116 that extend between the corresponding manifold process openings 154 and the base process openings 158.

The system 118 also operates to electrically isolate the field device 102 from the manifold 104 and, thus, any cathodic protection scheme implemented by the system 112 (FIG. 1A) using the gasket 166. That is, the system eliminates electrically conductive paths between the housing 144 of the field device and the manifold 104. In some embodiments, the system 118 may also include electrically insulating bolt sleeves 115 (FIG. 1B) for the bolts 148 (FIGS. 2 and 3) connecting the base 146 of the field device 102 to the manifold 104 to eliminate a conductive path between the manifold 104 and the base 146 through the bolts 148.

Some embodiments are directed to a method of sealing a fluid passageway between a coplanar interface 152 of a flange 155, such as that of a manifold 104, and a base interface 150 of a field device 102 for an industrial process and electrically insulating the field device 102 from the flange 155 using the sealing and electrically insulating system 118 formed in accordance with one or more embodiments described herein. While the following exemplary method specifically uses a flange of a manifold 104, it is understood that embodiments of the method include the use of any suitable flange having the coplanar interface 152.

Figure 13:
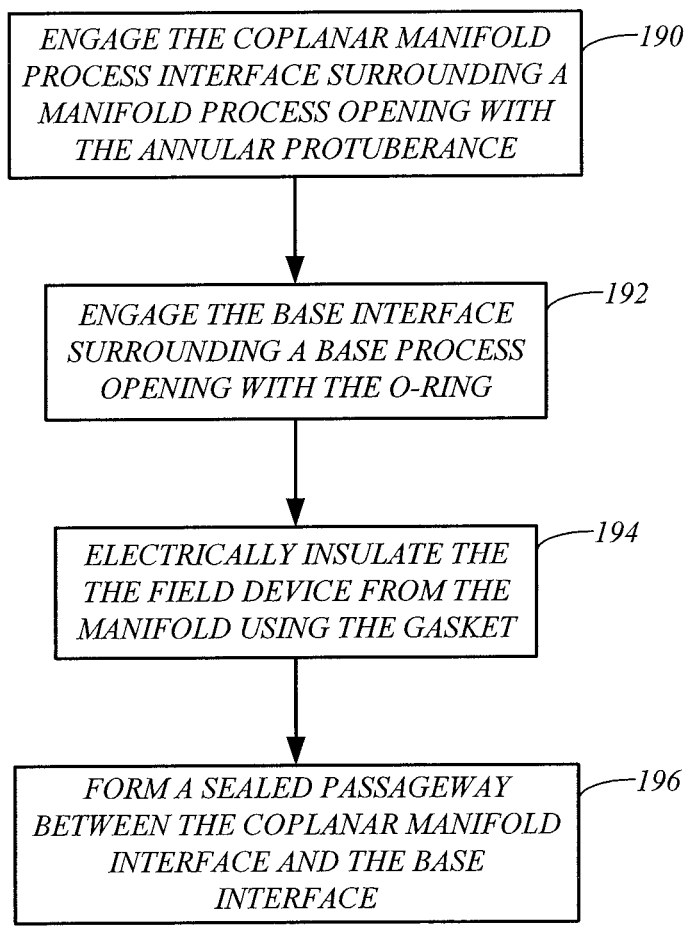
FIG. 13 is a flowchart of an exemplary method of sealing a fluid passageway between a manifold interface of a manifold and a base interface of a field device for an industrial process, and electrically insulating the field device from the manifold using the sealing and electrically insulating system formed in accordance with one or more embodiments described herein.

FIG. 13 is a flowchart illustrating an exemplary embodiment of the method, in which the system 118 includes a gasket 166 comprising a dielectric material, and an O-ring 168. The gasket 166 includes a gasket process opening 170 (e.g., opening 170A or 170B), a top surface 172, a bottom surface 174 that is opposite the top surface 172, and an annular protuberance 176 (e.g., annular protuberance 176A or 176B) extending from the bottom surface 174 and surrounding the gasket process opening 170, as shown in FIGS. 9-11. The O-ring 168 engages the top surface 172 of the gasket 166 surrounding the gasket process opening 170.

At 190 of the method, the protuberance 176 engages the coplanar interface 152 surrounding a manifold or flange process opening 154 (e.g., manifold or flange process opening 154A or 154B). At 192, the base interface 150 surrounding the base process opening is engaged with the O-ring 168. The field device 102 is electrically insulated from the flange 155 of the manifold 104 using the gasket 166, at 194. A sealed passageway 165 is formed, at 196, between the coplanar manifold interface 152 and the base interface 150 and through the manifold process opening 154, the gasket process opening 170, the O-ring 168, and the base process opening 158 by compressing the O-ring 168 and the gasket 166 between the base interface 150 and the coplanar manifold interface 152. Thus, the sealing and electrically insulating system 118 seals the interface 116 and electrically insulates the field device 102 from the manifold 104 (i.e., flange 155) from a cathodic protection scheme that may be implemented on the process vessel, such as a pipe 110 (FIG. 1A) or a tank containing a process material, for example.

Although the embodiments of the present disclosure have been described with reference to preferred embodiments, workers skilled in the art will recognize that changes may be made in form and detail without departing from the spirit and scope of the present disclosure.

What is claimed is:

1. A field device assembly for an industrial process comprising:
    an industrial process field device comprising:
        a pressure sensor; and
        a housing containing the pressure sensor and comprising a base including a base interface having a first base process opening;
    a flange attached to the base of the housing and including a coplanar interface having a first flange process opening; and
    a sealing and electrically insulating system comprising a gasket comprising a dielectric material and including a first gasket process opening aligned with the first base process opening and the first flange process opening, a first surface engaging the base interface, a second surface that is opposite the first surface engaging the coplanar interface; and
    wherein the gasket electrically insulates the housing of the field device from the flange; and
    a pressure at the first flange process opening is communicated to the pressure sensor through the first base process opening and via a first pressure sensing line.

2. The field device assembly of claim 1, wherein:
    the sealing and electrically insulating system includes a first O-ring engaging the first surface of the gasket surrounding the first gasket process opening and the base interface surrounding the first base process opening; and
    the first O-ring and the gasket form a first sealed passageway between the coplanar interface and the base interface and through the first flange process opening, the first gasket process opening, the first O-ring and the first base process opening.

3. The field device assembly of claim 2, wherein the gasket includes a first annular protuberance, which extends from the second surface, surrounds the first gasket process opening, and engages the coplanar interface surrounding the first flange process opening.

4. The field device assembly of claim 3, wherein a thickness of the gasket at the first annular protuberance is thicker than portions of the gasket surrounding the first annular protuberance.

5. The field device assembly of claim 4, wherein the thickness of the gasket at the first annular protuberance is approximately 10%-22% thicker than the portions of the gasket surrounding the first annular protuberance.

6. The field device assembly of claim 1, wherein:
    the base interface includes a second base process opening;
    the coplanar interface includes a second flange process opening; and a pressure at the second flange process opening is communicated to the pressure sensor through the second base process opening and via a second pressure sensing line; and the gasket includes a second gasket process opening aligned with the second base process opening and the second flange process opening.

7. The field device assembly of claim 6, wherein:
the sealing and electrically insulating system includes:
  a first O-ring engaging the first surface of the gasket surrounding the first gasket process opening and the base interface surrounding the first base process opening; and
  a second O-ring engaging the first surface of the gasket surrounding the second gasket process opening and the base interface surrounding the second base process opening;
  the first O-ring and the gasket form a first sealed passageway between the coplanar interface and the base interface and through the first flange process opening, the first gasket process opening, the first O-ring and the first base process opening; and
  the second O-ring and the gasket form a second sealed passageway between the coplanar interface and the base interface and through the second flange process opening, the second gasket process opening, the second O-ring and the second base process opening.

8. The field device assembly of claim 7, wherein the gasket includes:
  a first annular protuberance, which extends from the second surface, surrounds the first gasket process opening, and engages the coplanar interface surrounding the first flange process opening; and
  a second annular protuberance, which extends from the second surface, surrounds the second gasket process opening, and engages the coplanar interface surrounding the second flange process opening.

9. The field device assembly of claim 8, wherein a thickness of the gasket at the first and second annular protuberances is thicker than portions of the gasket surrounding the first and second annular protuberances.

10. The field device assembly of claim 9, wherein the thickness of the gasket at the first and second annular protuberances is approximately 10%-22% thicker than the portions of the gasket surrounding the first and second annular protuberances.

11. The field device assembly of claim 10, wherein the first surface of the gasket is substantially flat.

12. The field device assembly of claim 11, wherein a thickness of the gasket is substantially uniform except at the first and second protuberances.

13. The field device assembly of claim 12, wherein the gasket includes four bolt openings.

14. The system of claim 13, wherein:
  each of the first and second gasket process openings are circular and have a diameter of approximately 1.0 inch;
  the first and second gasket process openings are separated by a distance of approximately 0.30 inch;
  a width of the gasket is approximately 2.40 inches; and
  a length of the gasket is approximately 2.90 inches.

15. A field device assembly for an industrial process comprising:
  an industrial process field device comprising:
  a pressure sensor; and
  a housing containing the pressure sensor and comprising a base including a base interface having a first base process opening and a second base process opening;
  a flange attached to the base of the housing and including a coplanar interface having a first flange process opening and a second flange process opening; and
  a sealing and electrically insulating system comprising:
  a gasket comprising a dielectric material, a first gasket process opening aligned with the first base process opening and the first flange process opening, a second gasket process opening aligned with the second base process opening and the second flange process opening, a first surface engaging the base interface, a second surface opposite the first surface and engaging the coplanar interface, wherein the gasket electrically insulates the housing of the field device from the flange;
  a first O-ring engaging the first surface of the gasket surrounding the first gasket process opening and the base interface surrounding the first base process opening;
  a second O-ring engaging the first surface of the gasket surrounding the second gasket process opening and the base interface surrounding the second base process opening; and
  wherein a pressure at the first flange process opening is communicated to the pressure sensor through the first base process opening and a first pressure sensing line, and a pressure at the second flange process opening is communicated to the pressure sensor through the second base process opening and a second pressure sensing line.

16. The field device assembly of claim 15, wherein the gasket comprises:
  a first annular protuberance, which extends from the second surface, surrounds the first gasket process opening, and engages the coplanar interface surrounding the first flange process opening; and
  a second annular protuberance, which extends from the second surface, surrounds the second gasket process opening, and engages the coplanar interface surrounding the second flange process opening.

17. The field device assembly of claim 16, wherein a thickness of the gasket at the first and second annular protuberances is thicker than portions of the gasket surrounding the first and second annular protuberances.

18. The system of claim 17, wherein:
  each of the first and second gasket process openings are circular and have a diameter of approximately 1.0 inch;
  the first and second gasket process openings are separated by a distance of approximately 0.30 inch;
  a width of the gasket is approximately 2.40 inches; and
  a length of the gasket is approximately 2.90 inches.

19. A method of sealing a fluid passageway between a coplanar interface of a flange and a base interface of a field device for an industrial process having a pressure sensor, and electrically insulating the field device from the flange using a sealing and electrically insulating system, the method comprising:
  a gasket comprising a dielectric material, the gasket having a first gasket process opening, a first surface, a second surface opposite the first surface, and a first annular protuberance extending from the second surface and surrounding the first gasket process opening; and
  a first O-ring engaging the first surface of the gasket surrounding the first gasket process opening;
  the method comprising:
  engaging the coplanar interface surrounding a first flange process opening with the first annular protuberance;

engaging the base interface surrounding a first base process opening with the O-ring;
electrically insulating the field device from the flange using the gasket; and
forming a first sealed passageway between the coplanar interface and the base interface and through the first flange process opening, the first gasket process opening, the O-ring and the first base process opening comprising compressing the O-ring and the gasket between the base interface and the coplanar interface,
wherein a pressure at the first flange process opening is communicated to the pressure sensor through the first base process opening and via a first pressure sensing line.

* * * * *